United States Patent
Ma

(10) Patent No.: US 9,601,710 B2
(45) Date of Patent: *Mar. 21, 2017

(54) ORGANIC LIGHT-EMITTING DIODE WITH ENHANCED EFFICIENCY

(71) Applicant: NITTO DENKO CORPORATION, Ibaraki, Osaka (JP)

(72) Inventor: Liping Ma, San Diego, CA (US)

(73) Assignee: NITTO DENKO CORPORATION, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/574,147

(22) Filed: Dec. 17, 2014

(65) Prior Publication Data
US 2015/0179966 A1 Jun. 25, 2015

Related U.S. Application Data

(63) Continuation of application No. 13/577,221, filed as application No. PCT/US2011/023404 on Feb. 1, 2011, now Pat. No. 8,933,439.

(Continued)

(51) Int. Cl.
*H01L 29/08* (2006.01)
*H01L 33/00* (2010.01)
(Continued)

(52) U.S. Cl.
CPC ........ *H01L 51/504* (2013.01); *H01L 51/0085* (2013.01); *H01L 51/5016* (2013.01);
(Continued)

(58) Field of Classification Search
CPC .............. H01L 51/5016; H01L 51/504; H01L 51/0085; H01L 51/5036; H01L 51/0037; H01L 51/0059
(Continued)

(56) References Cited

U.S. PATENT DOCUMENTS 6,010,796 A 1/2000 Kijima
6,967,062 B2 11/2005 Hatwar et al.
(Continued)

FOREIGN PATENT DOCUMENTS

JP 2004-311231 11/2004
JP 2007-027992 2/2007
(Continued)

OTHER PUBLICATIONS

Billmeyer, et al., "Principles of Color Technology", 2nd edition, John Wiley & Sons, Inc., New York, 1981.
(Continued)

*Primary Examiner* — Dzung Tran
(74) *Attorney, Agent, or Firm* — Knobbe, Martens, Olson & Bear, LLP

(57) ABSTRACT

Generally, the devices provided herein comprise at least a hole-transport layer, two light-emitting layers, and an electron-transport layer, each having a highest occupied molecular orbital (HOMO) energy level and a lowest unoccupied molecular orbital (LUMO) energy level, wherein at least one of the HOMO energy levels and/or the LUMO energy levels of at least one of the light-emitting layers does not decrease in a stepwise fashion.

19 Claims, 6 Drawing Sheets

Related U.S. Application Data

(60) Provisional application No. 61/301,694, filed on Feb. 5, 2010.

(51) Int. Cl.

| *H01L 21/31* | (2006.01) |
|---|---|
| *H01J 1/62* | (2006.01) |
| *H01L 51/50* | (2006.01) |
| *H01L 51/00* | (2006.01) |

(52) U.S. Cl.
CPC ...... *H01L 51/5036* (2013.01); *H01L 51/0037* (2013.01); *H01L 51/0059* (2013.01); *H01L 51/0062* (2013.01); *H01L 51/0067* (2013.01); *H01L 51/0094* (2013.01); *H01L 51/5056* (2013.01); *H01L 51/5072* (2013.01); *H01L 2251/552* (2013.01)

(58) Field of Classification Search
USPC ....... 257/40, 98, E51.026; 438/765; 313/504
See application file for complete search history.

(56) References Cited

U.S. PATENT DOCUMENTS

| 7,045,952 | B2 | 5/2006 | Lu |
| 7,198,859 | B2 | 4/2007 | Kwong et al. |
| 7,211,823 | B2 | 5/2007 | Tung et al |
| 8,933,439 | B2 | 1/2015 | Ma et al. |
| 2002/0197511 | A1 | 12/2002 | D'Andrade et al. |
| 2003/0020073 | A1 | 1/2003 | Long et al. |
| 2005/0006641 | A1 | 1/2005 | Tung et al. |
| 2005/0006642 | A1 | 1/2005 | Tung et al. |
| 2006/0108578 | A1* | 5/2006 | Liu .................... H01L 51/441 257/40 |
| 2006/0231843 | A1* | 10/2006 | Qin .................... H01L 51/5016 257/79 |
| 2006/0232194 | A1* | 10/2006 | Tung .................... C09K 11/06 313/504 |
| 2006/0279203 | A1 | 12/2006 | Forrest et al. |
| 2007/0035240 | A1 | 2/2007 | Yang et al. |
| 2007/0099026 | A1 | 5/2007 | Lee et al. |
| 2008/0224605 | A1 | 9/2008 | Noh et al. |
| 2008/0290791 | A1 | 11/2008 | Lee et al. |
| 2009/0026929 | A1 | 1/2009 | Song et al. |
| 2009/0045728 | A1* | 2/2009 | Murano ............... H01L 51/5278 313/504 |
| 2009/0102366 | A1 | 4/2009 | Ushikubo et al. |
| 2009/0200927 | A1 | 8/2009 | D'Andrade et al. |
| 2009/0302313 | A1 | 12/2009 | Choi et al. |
| 2010/0314612 | A1 | 12/2010 | Lee et al. |
| 2011/0140093 | A1* | 6/2011 | Zheng .................. C07D 235/18 257/40 |

FOREIGN PATENT DOCUMENTS

| JP | 2007-173827 | 7/2007 |
| JP | 2007-335214 | 12/2007 |
| JP | 2008-277494 | 11/2008 |
| JP | 2011-151097 | 8/2011 |
| WO | WO 2009/008346 | 1/2009 |
| WO | WO 2011/097259 | 8/2011 |

OTHER PUBLICATIONS

CIE 1971, International Commission on Illumination, Colorimetry: Official Recommendations of the International Commission on Illumination, Publication CIE No. 15 (E-1.3.1) 1971, Bureau Central de la CIE, Paris, 1971.
International Search Report and Written Opinion in PCT Application No. PCT/US2011/023404, dated Mar. 25, 2011.
International Preliminary Report on Patentability in PCT Application No. PCT/US2011/023404, dated Aug. 16, 2012.
Reineke et al., "White Organic Light-Emitting Diodes with Fluorescent Tube Efficiency", Nature, May 14, 2009, vol. 459, Issue 7244, pp. 234-238.
Su et al., "Highly Efficient Organic Blue-and White-Light-Emitting Devices Having a Carrier- and Exciton-Confining Structure for Reduced Efficiency Roll-Off", Advanced Materials, 2008, vol. 20, pp. 4189-4194.
Wang et al., "Manipulating Charges and Excitons within a Single-Host System to Accomplish Efficiency/CRI/Color-Stability Trade-off for High-Performance OWLEDs", Advanced Materials, 2009, vol. 21, pp. 2397-2401.
Official Communication in Japanese Application No. 2016-009791, dated Nov. 30, 2016.

* cited by examiner

ORGANIC LIGHT-EMITTING DIODE WITH ENHANCED EFFICIENCY

CROSS-REFERENCE TO RELATED APPLICATIONS

This application is a continuation of U.S. patent application Ser. No. 13/577,221, filed Nov. 28, 2012, which is a U.S. national phase under 35 U.S.C. §371 of International Application No. PCT/US2011/023404, filed Feb. 1, 2011, which claims the benefit of U.S. Provisional Application No. 61/301,694, filed Feb. 5, 2010. The contents of each of these applications are incorporated by reference herein in their entireties.

BACKGROUND

Field

The embodiments described herein relate to organic light-emitting diodes, such as organic light-emitting diodes comprising a hole-transport layer, two light-emitting layers, and an electron-transport layer.

Description of the Related Art

White organic light emitting devices (WOLED) are becoming increasingly important for lighting applications. For example, WOLEDs may be able to replace fluorescent tubes to save energy. Thus there is a continuing need to improving the power efficiency of WOLEDs.

Many of the current WOLEDs comprise a hole-transport layer, at least two light-emitting layers, and an electron-transport layer arranged in that order. In these devices, each layer has a highest occupied molecular orbital (HOMO) energy level and a lowest unoccupied molecular orbital (LUMO) energy level, wherein the HOMO energy levels and/or the LUMO energy levels decrease in a stepwise fashion. In other words, with the energy levels of the first light-emitting layer are lower than the corresponding energy levels of the hole-transport layer (e.g. the HOMO of first light-emitting layer is lower than the HOMO of the hole-transport layer, the LUMO of the first light-emitting layer is lower than the LUMO of the hole-transport layer), the energy levels of the second light-emitting layer are lower than the corresponding energy levels of the first light-emitting layer, and the energy levels of the electron-transport layer are lower than the corresponding energy levels of the second light-emitting layer. These devices may suffer from the problems of electron leakage from the light-emitting layers through the hole-transport layer to the anode, and hole leakage from the light-emitting layers through the electron-transport layer to the cathode, thus reducing the device efficiency. Traditionally, hole-blocking and electron-blocking layers have sometimes been used to attempt to address this problem, but the additional layers add expense and complexity to the device fabrication and may reduce device efficiency.

Other devices may utilize hole-transport layers with very high LUMOs to block electron leakage to the anode an/or electron-transport layers with very low HOMOs to block hole leakage to the cathode. Unfortunately, the large energy gap between the corresponding molecular orbital of the hole-transport layer or the electron-transport layer and the corresponding electrode can significantly reduce hole or electron mobility. The reduced mobility can in turn cause reduced efficiency of the device. The large energy gap may also cause higher driving voltage. Thus, it is difficult to improve efficiency using this approach.

Thus, additional options for addressing these problems are needed.

SUMMARY

Generally, the devices provided herein comprise at least a hole-transport layer, two light-emitting layers, and an electron-transport layer, arranged in that order. In these devices, each layer has a highest occupied molecular orbital (HOMO) energy level and a lowest unoccupied molecular orbital (LUMO) energy level, and at least one of the HOMO energy levels and/or the LUMO energy levels of at least one of the light-emitting layers does not decrease in a stepwise fashion. In other words, one of the energy levels of the first light-emitting layer is not lower than one of the corresponding energy levels of the hole-transport layer (e.g. the HOMO of first light-emitting layer is not lower than the HOMO of the hole-transport layer and/or the LUMO of the first light-emitting layer is not lower than the LUMO of the hole-transport layer), one of the energy levels of the second light-emitting layer is not lower than one of the corresponding energy levels of the first light-emitting layer, and/or one of the energy levels of the electron-transport layer is not lower than one of the corresponding energy levels of the second light-emitting layer.

For example, some embodiments provide an organic light-emitting device comprising: a cathode, an anode, and a series of organic layers disposed between the anode and the cathode, wherein the series of organic layers comprises: a first light-emitting layer deposited between the anode and the cathode, wherein the first light-emitting layer comprises a first host material and a first emissive material; a hole-transport layer, disposed between the anode and the first light-emitting layer a second light-emitting layer disposed between the first light-emitting layer and the cathode, wherein the second light-emitting layer comprises a second host material and a second emissive material; and an electron-transport layer disposed between the second light-emitting layer and the cathode; wherein a HOMO energy level of the hole-transport layer is higher than a HOMO energy level of the electron-transport layer, and a LUMO energy level of the hole-transport layer is higher than a LUMO energy level of the electron transport layer; and at least one of the following relationships exists: a HOMO energy level of the first light-emitting layer is higher than the HOMO energy level of the hole-transport layer; a LUMO energy level of the first light-emitting layer is lower than a LUMO energy level of the second light-emitting layer; a HOMO energy level of the second light-emitting layer is higher than the HOMO energy level of the first light-emitting layer; or the LUMO energy level of the second light-emitting layer is lower than a LUMO energy level of the electron-transport layer.

These and other embodiments are described in greater detail below.

DETAILED DESCRIPTION OF SOME EMBODIMENTS

Figure 1:
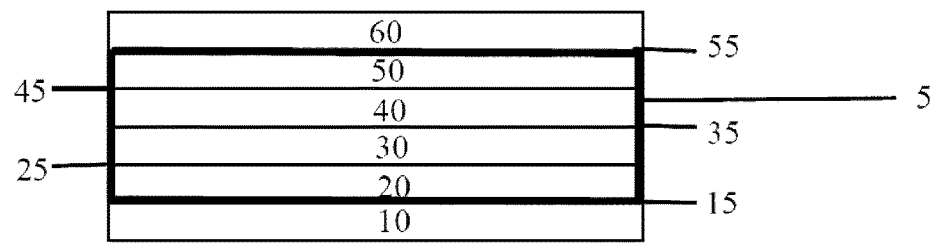
FIG. 1 provides a schematic of the structure of some embodiments of a device described herein.

FIG. 1 provides a schematic of the structure of some embodiments of a device described herein. These devices comprise an anode 10 and a cathode 60, and a series of organic layers 5 disposed between the anode 10 and the cathode 60. In these embodiments, the organic layers 5 comprise at least a hole-transport layer 20, a first light-emitting layer 30, a second light-emitting layer 40, and electron-transport layer 50, positioned in the order depicted. In some embodiments, the device may be configured to allow holes to be transported from the anode to the first light-emitting layer and the second light-emitting layer and allow electrons to be transported from the cathode to the first light-emitting layer and the second light-emitting layer. The organic layer may optionally further comprise one or more of the following: a first optional layer 15, disposed between the anode 10 and the hole-transport layer; a second optional layer 25, disposed between the hole-transport layer 20 and the first light-emitting layer 30; a third optional layer 35, disposed between the first light-emitting layer 30 and the second light-emitting layer 40; a fourth optional layer 45, disposed between the second light-emitting layer 40 and the electron-transport layer 50; and a fifth optional layer 55, disposed between the electron-transport layer 50 and the cathode 60. These optional layers may be any type of layer such as a hole-injecting layer, a hole-blocking layer, an exciton-blocking layer, an electron-injecting layer, an electron-blocking layer, etc. In some embodiments, the first optional layer 15, if present, the second optional layer 25, if present, and the third optional layer 35, if present, are independently selected from a hole-injecting layer, an electron-blocking layer, and an exciton-blocking layer. In some embodiments, the third optional layer 35, the fourth optional layer 45, and the fifth optional layer 55, if present, are independently selected from an electron-injecting layer, a hole-blocking layer, and an exciton-blocking layer. In some embodiments, the first optional layer 15 is a hole-injecting layer. In some embodiments, the fifth optional layer 55 is an electron-injecting layer.

FIGS. 2-8 depict the highest occupied molecular orbital (HOMO) energy levels and lowest unoccupied molecular orbital (LUMO) energy levels for the different layers, the anode work function $10y$, and the cathode work function $60V$ for some embodiments. The terms "highest occupied molecular orbital energy level" or "HOMO energy level" have the ordinary meaning understood by a person of ordinary skill in the art. In some embodiments, the HOMO energy level of a material includes the energy level of the highest energy molecular orbital of that material that is occupied with at least one electron in the ground state. The terms "lowest unoccupied molecular orbital energy level" or "LUMO energy level" have the ordinary meaning understood by a person of ordinary skill in the art. In some embodiments, the LUMO energy level of a material includes the energy level of the lowest energy molecular orbital of that material that contains no electrons in the ground state. The "work function" of a metal or electrical conductor is a measure of the minimum energy required to extract an electron from the surface of the metal or conductor.

In these embodiments, the HOMO energy level 20H of the hole-transport layer 20 (HT) is higher than the HOMO energy level 50H of the electron-transport layer 50 (ET), and the LUMO energy level 20L of the hole-transport layer 20 is higher than the LUMO energy level SOL of the electron transport layer 50. In some embodiments, the anode 10 work function 10V may be higher than the HOMO energy level 20H of the hole-transport layer 20, and the work function of the 60V cathode 60 may be lower than the LUMO energy level SOL of the electron transport layer 50.

Figure 2:
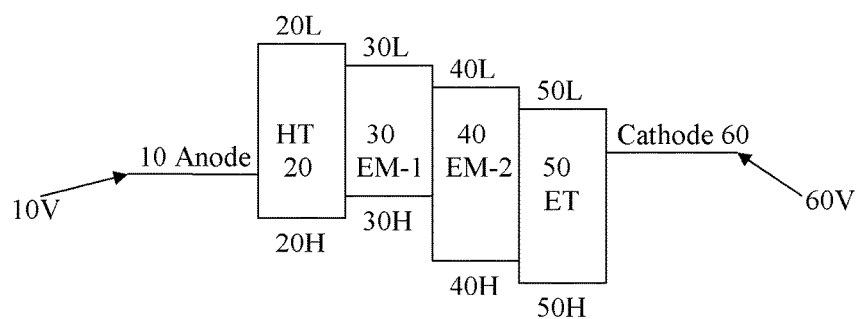
FIG. 2 depicts the highest occupied molecular orbital (HOMO) energy levels and lowest unoccupied molecular orbital (LUMO) energy levels for the different layers, the anode work function, and the cathode work function for some embodiments.

With respect to FIG. 2, in some embodiments, the HOMO energy level 30H of the first light-emitting layer 30 (EM-1) may be higher than the HOMO energy level 20H of the hole-transport layer 20. For example, the HOMO energy level 30H of the first light-emitting layer 30 (EM-1) may be higher than the HOMO energy level 20H of the hole-transport layer 20 by about 0.05 eV to about 0.70 eV, about 0.1 eV to about 0.3 eV, or about 0.1 eV to about 0.2 eV. In some embodiments, 1, 2, 3, 4, or 5 of the following relationships exist: 1) the HOMO energy level 50H of the electron-transport layer 50 is lower than the HOMO energy level 40H of the second light-emitting layer 40 (EM-2), 2) the HOMO energy level 40H of the second light-emitting layer 40 is lower than the HOMO energy level 20H of the hole-transport layer 20, 3) the LUMO energy level SOL of the electron-transport layer 50 is lower than the LUMO energy level 40L of the second light-emitting layer 40, 4) the LUMO energy level 40L of the second light-emitting layer 40 is lower than the LUMO energy level 30L of the first light-emitting layer 30, and 5) the LUMO energy level 30L of the first light-emitting layer 30 is lower than the LUMO energy level 20L of the hole-transport layer 20.

Figure 3:
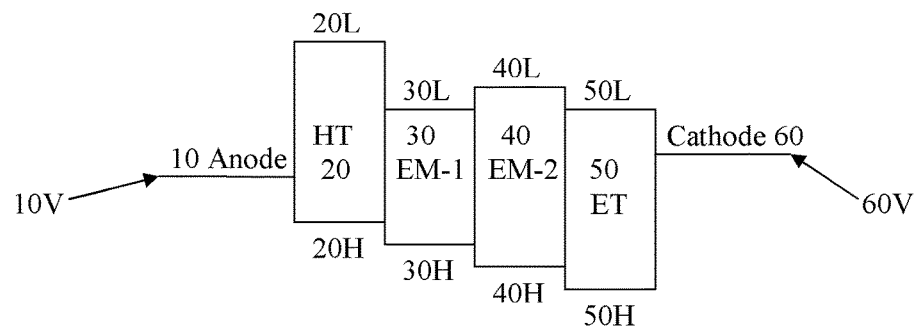
FIG. 3 depicts the HOMO energy levels and LUMO energy levels for the different layers, the anode work function, and the cathode work function for some embodiments.

With respect to FIG. 3, in some embodiments, the LUMO energy level 30L of the first light-emitting layer 30 may be lower than the LUMO energy level 40L of the second light-emitting layer 40. For example, the LUMO energy level 30L of the first light-emitting layer 30 may be lower than the LUMO energy level 40L of the second light-emitting layer 40 by about 0.05 eV to about 0.70 eV, about 0.1 eV to about 0.3 eV, or about 0.1 eV to about 0.2 eV. In some embodiments, 1, 2, 3, 4, or 5 of the following relationships exist: 1) the HOMO energy level 50H of the electron-transport layer 50 is lower than the HOMO energy level 40H of the second light-emitting layer 40, 2) the HOMO energy level 40H of the second light-emitting layer 40 is lower than the HOMO energy level 30H of the first light-emitting layer 30, 3) the HOMO energy level 30H of the first light-emitting layer 30 is lower than HOMO energy level 20H of the hole-transport layer 20, 4) the LUMO energy level SOL of the electron-transport layer 50 is lower than the LUMO energy level 40L of the second light-emitting layer 40, and 5) the LUMO energy level 40L of the second light-emitting layer 40 is lower than the LUMO energy level 20L of the hole-transport layer 20.

Figure 4:
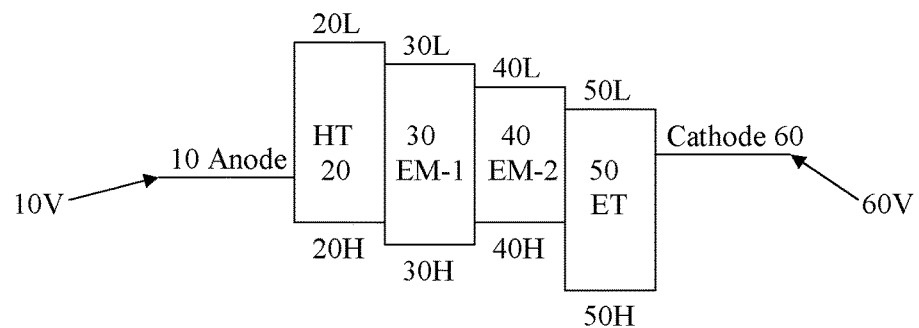
FIG. 4 depicts the HOMO energy levels and LUMO energy levels for the different layers, the anode work function, and the cathode work function for some embodiments.

With respect to FIG. 4, in some embodiments the HOMO energy level 40H of the second light-emitting layer 40 may be higher than the HOMO energy level 30H of the first light-emitting layer 30. For example, the HOMO energy level 40H of the second light-emitting layer 40 may be higher than the HOMO energy level 30H of the first light-emitting layer 30 by about 0.05 eV to about 0.70 eV, about 0.1 eV to about 0.3 eV, or about 0.1 eV to about 0.2 eV. In some embodiments, 1, 2, 3, 4, or 5 of the following relationships exist: 1) the HOMO energy level 50H of the electron-transport layer 50 is lower than the HOMO energy level 30H of the first light-emitting layer 30, 2) the HOMO energy level 30H of the first light-emitting layer 30 is lower than the HOMO energy level 20H of the hole-transport layer 20, 3) the LUMO energy level SOL of the electron-transport layer 50 is lower than the LUMO energy level 40L of the second light-emitting layer 40, 4) the LUMO energy level 40L of the second light-emitting layer 40 is lower than the LUMO energy level 30L of the first light-emitting layer 30, and 5) the LUMO energy level 30L of the first light-emitting layer 30 is lower than the LUMO energy level 20L of the hole-transport layer 20.

Figure 5:
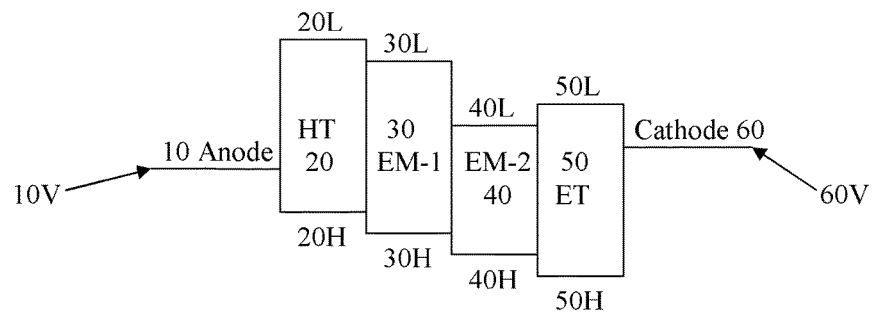
FIG. 5 depicts the HOMO energy levels and LUMO energy levels for the different layers, the anode work function, and the cathode work function for some embodiments.
Figure 6:
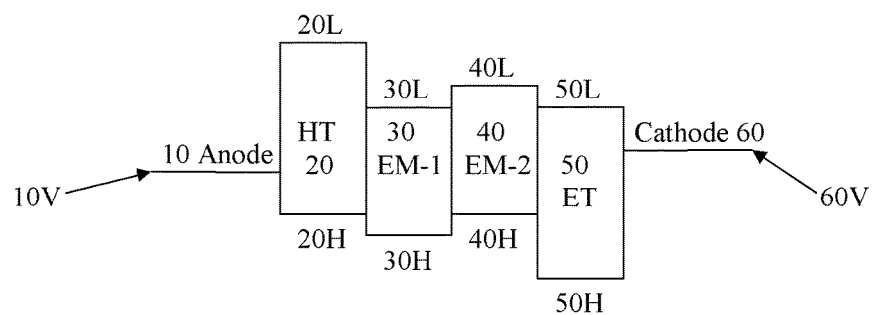
FIG. 6 depicts the HOMO energy levels and LUMO energy levels for the different layers, the anode work function, and the cathode work function for some embodiments.

With respect to FIG. 5, in some embodiments the LUMO energy level 40L of the second light-emitting layer 40 may be lower than the LUMO energy level SOL of the electron-transport layer 50. For example, the LUMO energy level 40L of the second light-emitting layer 40 may be lower than the LUMO energy level SOL of the electron-transport layer 50 by about 0.05 eV to about 0.70 eV, about 0.1 eV to about 0.3 eV, or about 0.1 eV to about 0.2 eV. In some embodiments, 1, 2, 3, 4, or 5 of the following relationships exist: 1) the HOMO energy level 50H of the electron-transport layer 50 is lower than the HOMO energy level 40H of the second light-emitting layer 40, 2) the HOMO energy level 40H of the second light-emitting layer 40 is lower than the HOMO energy level 30H of the first light-emitting layer 30, 3) the HOMO energy level 30H of the first light-emitting layer 30 is lower than HOMO energy level 20H of the hole-transport layer 20, 4) the LUMO energy level SOL of the electron-transport layer 50 is lower than the LUMO energy level 30L of the first light-emitting layer 30, and 5) the LUMO energy level 30L of the first light-emitting layer 30 is lower than the LUMO energy level 20L of the hole-transport layer 20.

The combination of relationships between the various HOMO and LUMO energy levels with respect to FIGS. 2-5 provides a variety of different energetic structures. For example, in FIG. 6, the HOMO energy level 40H of the second light-emitting layer is higher than the HOMO energy level 30H of the first light-emitting layer 30, and the LUMO energy level 30L of the first light-emitting layer 30 is lower than the LUMO energy level 40L of the second light-emitting layer 40. Furthermore, in some embodiments, the HOMO energy level 50H of the electron-transport layer 50 is lower than the HOMO energy level 30H of the first light-emitting layer 30, the HOMO energy level 30H of the first light-emitting layer 30 is lower than the HOMO energy level 20H of the hole-transport layer 20, the LUMO energy level SOL of the electron-transport layer 50 is lower than the LUMO energy level 40L of the second light-emitting layer 40, and the LUMO energy level 40L of the second light-emitting layer 40 is lower than the LUMO energy level 20L of the hole-transport layer 20.

Figure 7:
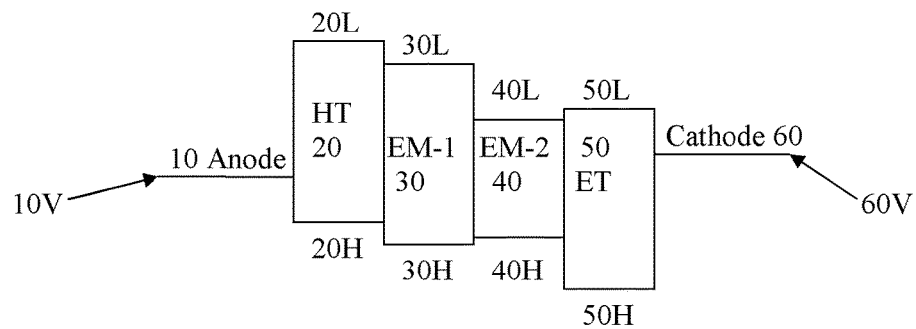
FIG. 7 depicts the HOMO energy levels and LUMO energy levels for the different layers, the anode work function, and the cathode work function for some embodiments.

FIG. 7 depicts the energetic structure of some embodiments. In these devices, the HOMO energy level 40H of the second light-emitting layer 40 is higher than the HOMO energy level 30H of the first light-emitting layer 30, and the LUMO energy level 40L of the second light-emitting layer 40 is lower than the LUMO energy level SOL of the electron-transport layer 50. Furthermore, in some embodiments, the HOMO energy level 50H of the electron-transport layer 50 is lower than the HOMO energy level 30H of the first light-emitting layer 30, the HOMO energy level 30H of the first light-emitting layer 30 is lower than the HOMO energy level 20H of the hole-transport layer 20, the LUMO energy level SOL of the electron-transport layer 50 is lower than the LUMO energy level 30L of the first light-emitting layer 30, and the LUMO energy level 30L of the first light-emitting layer 30 is lower than the LUMO energy level 20L of the hole-transport layer 20.

Figure 8:
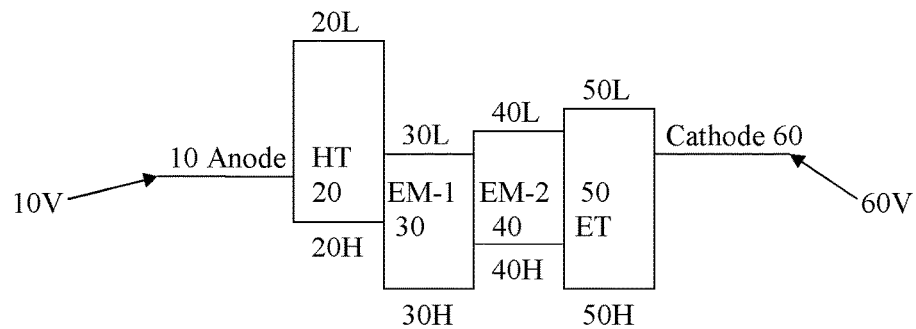
FIG. 8 depicts the HOMO energy levels and LUMO energy levels for the different layers, the anode work function, and the cathode work function for some embodiments.

FIG. 8 depicts the energetic structure of some embodiments. In these devices, the HOMO energy level 40H of the second light-emitting layer 40 is higher than the HOMO energy level 30H of the first light-emitting layer 30, the LUMO energy level 30L of the first light-emitting layer 30 is lower than the LUMO energy level 40L of the second light-emitting layer 40, and the LUMO energy level 40L of the second light-emitting layer 40 is lower than the LUMO energy level 50L of the electron-transport layer 50.

The cathode may include any material having a lower work function than the anode layer. Examples of suitable materials for the cathode layer include those selected from alkali metals of Group 1; Group 2 metals; Group 3 metals; Group 12 metals including rare earth elements, lanthanides and actinides; materials such as aluminum, indium, calcium, barium, samarium and magnesium; and combinations thereof. Li-containing organometallic compounds, LiF, and $Li_2O$ may also be deposited between the organic layer and the cathode layer to lower the operating voltage. Suitable low work function metals include but are not limited to Al, Ag, Mg, Ca, Cu, Mg/Ag, LiF/Al, CsF, CsF/Al or alloys thereof. In some embodiments, the cathode layer can have a thickness in the range of about 1 nm to about 1000 nm.

Approximate work functions of some materials which may be useful in a cathode are included in Table 1 below.

TABLE 1

| Metal | Work Function (eV) |
| --- | --- |
| LiF/Al | 2.6 |
| Mg | 3.72 |
| Mg/Ag | 4.12 |
| Al | 4.28 |

The anode layer may comprise any material having a higher work function than the cathode layer. In some embodiments, the anode layer may comprise a conventional material such as a metal, mixed metal, alloy, metal oxide or mixed-metal oxide, or a conductive polymer. Examples of suitable metals include the Group 1 metals, the metals in Groups 4, 5, 6, and the Group 8-10 transition metals. If the anode layer is to be light-transmitting, mixed-metal oxides of Group 12, 13, and 14 metals or oxides of combinations thereof, such as Au, Pt, and indium-tin-oxide (ITO), may be used. The anode layer may include an organic material such as polyaniline, e.g., as described in "Flexible light-emitting diodes made from soluble conducting polymer," Nature, vol. 357, pp. 477-479 (11 Jun. 1992), graphene, e.g., as described in H. P. Boehm, R. Setton and E. Stumpp (1994). "Nomenclature and terminology of graphite intercalation compounds". Pure and Applied Chemistry 66: 1893-1901, and/or carbon nanotubes, e.g., Juni, et al, US App 20080152573 (WO/2008/140505). Examples of suitable high work function electrical conductors include but are not limited to Au, Pt, indium-tin-oxide (ITO), or alloys thereof. In an embodiment, the anode layer can have a thickness in the range of about 1 nm to about 1000 nm.

Approximate work functions of some materials which may be useful in an anode are included in Table 2 below.

TABLE 2

| Metal | Work Function (eV) |
|---|---|
| indium-tin-oxide (ITO) | 4.7 |
| indium-zinc-oxide (IZO) | 4.7 |
| Al | 4.28 |
| Ag | 4.26 |
| Zn | 4.33 |
| Zr | 4.05 |
| Sn | 4.42 |
| V | 4.3 |
| Hg | 4.49 |
| In | 4.12 |
| Ti | 4.3 |

The series of organic layers includes a hole-transport layer, an electron-transport layer, a first light-emitting layer, a second light-emitting layer, and may also include optional layers disposed in any position between these layers, or may be one or both of the outside layers which contact the anode or the cathode.

The hole-transport layer may be any layer which is capable of transporting holes between the 2 layers it contacts. Examples of the 2 layers that the hole-transport layer may contact include the anode and the first light-emitting layer, a hole-injecting layer and the first light-emitting layer, the anode and an electron-blocking layer, the anode and an exciton-blocking layer, etc. The hole-transport layer may include any material having HOMO and LUMO energy levels which are suitable for a device described herein, and may include hole-transport materials known by those skilled in the art. In some embodiments, the hole-transport layer comprises a hole-transport compound having a HOMO energy level and a LUMO energy level, wherein the HOMO energy level of the hole-transport layer is about equal to the HOMO energy level of the hole-transport compound, and the LUMO energy level of the hole-transport layer is about equal to the LUMO energy level of the hole-transport compound.

In some embodiments, the hole-transport compound may be an aromatic-substituted amine, a carbazole, a polyvinylcarbazole (PVK), e.g. poly(9-vinylcarbazole); polyfluorene; a polyfluorene copolymer; poly(9,9-di-n-octylfluorene-alt-benzothiadiazole); poly(paraphenylene); poly[2-(5-cyano-5-methylhexyloxy)-1,4-phenylene]; a benzidine; a phenylenediamine; a phthalocyanine metal complex; a polyacetylene; a polythiophene; a triphenylamine; an oxadiazole; copper phthalocyanine; 1,1-Bis(4-bis(4-methylphenyl)aminophenyl)cyclohexane; 2,9-Dimethyl-4,7-diphenyl-1,10-phenanthroline; 3,5 -Bis(4-tert-butyl-phenyl)-4-phenyl[1,2,4]triazole; 3,4,5-Triphenyl-1,2,3-triazole; 4,4',4'-tris(3-methylphenylphenylamino)triphenylamine (MTDATA); N,N'-bis(3-methylphenyl)N,N'-diphenyl-[1,1'-biphenyl]-4,4'-diamine (TPD); 4,4'-bis[N-(naphthyl)-N-phenyl-amino]biphenyl (α-NPD); 4,4',4"-tris(carbazol-9-yl)-triphenylamine (TCTA); 4,4'-bis[N,N'-(3-toly)amino]-3,3'-dimethylbiphenyl (HMTPD); 4,4'-N,N'-dicarbazole-biphenyl (CBP); 1,3-N,N-dicarbazole-benzene (mCP); Bis [4-(p,p'-ditolyl-amino)phenyl]diphenylsilane (DTAS i); 2,2'-bis(4-carbazolylphenyl)-1,1'-biphenyl (4CzPBP); N,N'N"-1,3,5-tricarbazoloylbenzene (tCP); N,N'-bis(4-butylphenyl)-N,N'-bis(phenyl)benzidine; or the like.

Approximate LUMO energy levels and HOMO energy levels of some materials which may be useful as hole-transport material are included in Table 3 below.

TABLE 3

| Hole-transport compound | LUMO energy level (eV) | HOMO energy level (eV) |
|---|---|---|
| DTASi | −2.20 | −5.60 |
| TCTA | −2.43 | −5.83 |
| CBP | −2.80 | −6.10 |
| α-NPD | −2.40 | −5.50 |
| 4CzPBP | −2.60 | −6.06 |

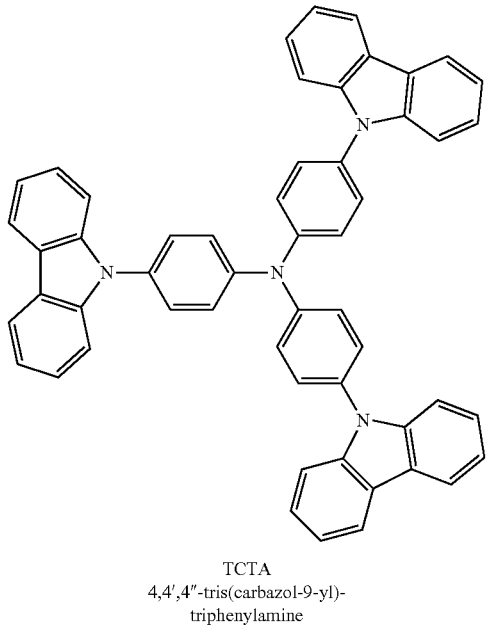

TCTA
4,4',4"-tris(carbazol-9-yl)-triphenylamine

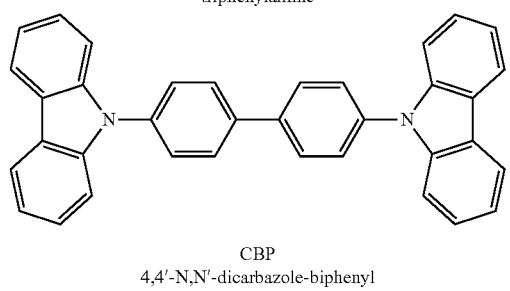

CBP
4,4'-N,N'-dicarbazole-biphenyl

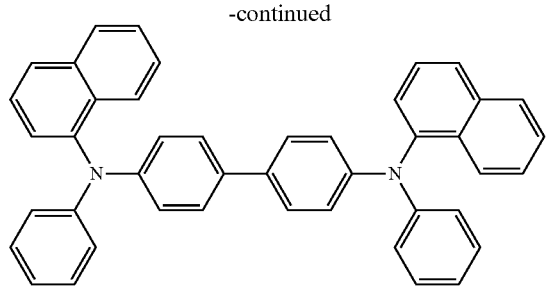

α-NPD
4,4′-bis[N-(naphthyl)-N-phenyl-amino]biphenyl

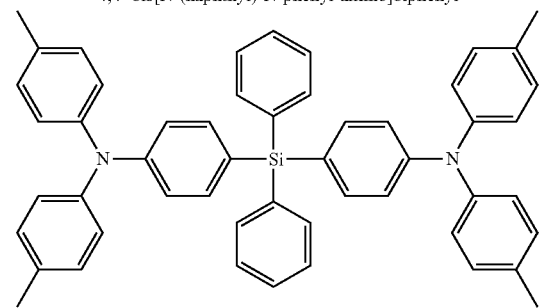

DTASi
Bis[4-(p,p′-ditolyl-amino)phenyl]diphenylsilane

In some embodiments, the hole-transport layer is formed of material that also functions as an electron blocking layer. In some embodiments, the hole-transport layer comprises material that also enables it to function as an exciton blocking layer.

The electron-transport layer may be any layer which is capable of transporting electrons between the 2 layers it contacts. Examples of the 2 layers that the electron-transport layer may contact include the cathode and the second light-emitting layer, a electron-injecting layer and the second light-emitting layer, the cathode and a hole-blocking layer, the cathode and an exciton-blocking layer, etc. The electron-transport layer may include any material having HOMO and LUMO energy levels which are suitable for a device described herein, and may include electron-transport materials known by those skilled in the art. In some embodiments, the electron-transport layer comprises an electron-transport compound having a HOMO energy level and a LUMO energy level, wherein the HOMO energy level of the electron-transport layer is about equal to the HOMO energy level of the electron-transport compound, and the LUMO energy level of the electron-transport layer is about equal to the LUMO energy level of the electron-transport compound.

In some embodiments, the electron-transport compound may be 2-(4-biphenylyl)-5-(4-tert-butylphenyl)-1,3,4-oxadiazole (PBD); 1,3-bis(N,N-t-butyl-phenyl)-1,3,4-oxadiazole (OXD-7), 1,3-bis[2-(2,2′-bipyridine-6-yl)-1,3,4-oxadiazo-5-yl]benzene; 3-phenyl-4-(1′-naphthyl)-5-phenyl-1,2,4-triazole (TAZ); 2,9-dimethyl-4,7-diphenyl-phenanthroline (bathocuproine or BCP); aluminum tris(8-hydroxyquinolate) (Alq3); 1,3,5-tris(2-N-phenylbenzimidazolyl)benzene (TPBI); 1,3-bis[2-(2,2′-bipyridine-6-yl)-1,3,4-oxadiazo-5-yl]benzene (BPY-OXD), or the like.

The LUMO energy level and HOMO energy level of some materials which may be useful as electron-transport material are included in Table 3 below.

TABLE 3

| Electron-transport material | LUMO energy level (eV) | HOMO energy level (eV) |
|---|---|---|
| TPBI | −2.70 | −6.20 |
| PBD | −2.60 | −6.20 |
| OXD-7 | −2.60 | −6.40 |
| TAZ | −2.70 | −6.30 |
| AlQ3 | −3.00 | −5.70 |
| BCP | −2.80 | −6.10 |

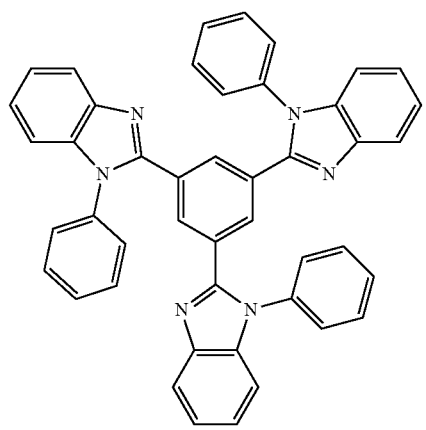

TPBI
1,3,5-tris(N-phenylbenzimidizol-2-yl)benzene

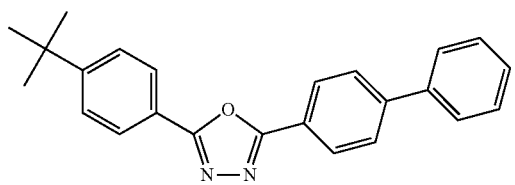

PBD
2-(4-biphenylyl)-5-(4-tert-butylphenyl)-1,3,4-oxadiazole

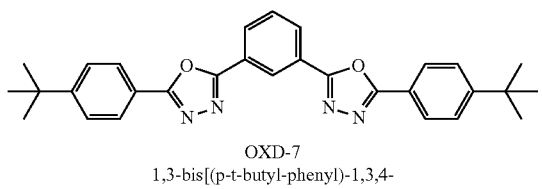

OXD-7
1,3-bis[(p-t-butyl-phenyl)-1,3,4-oxadiazole]benzene

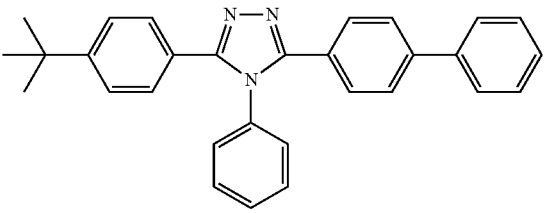

TAZ
3-(4-Biphenylyl)-4-phenyl-5-tert-butylphenyl-1,2,4-triazole

-continued

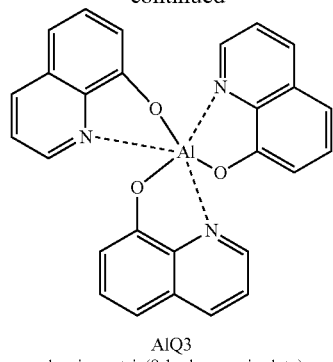

AlQ3
aluminum tris(8-hydroxyquinolate)

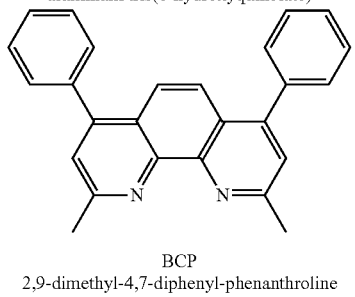

BCP
2,9-dimethyl-4,7-diphenyl-phenanthroline

In other embodiments, the energy difference between the LUMO of the material(s) that can be included in the electron-transport layer and the work function of the cathode layer is small enough to allow efficient electron transport from the cathode. In some embodiments, the electron-transport layer is formed of material that also functions as a hole blocking layer. In some embodiments, the electron-transport layer comprises material that also enables it to function as an exciton blocking layer.

The first host material of the first light-emitting layer may be at least one of: one or more hole-transport materials, one or more electron-transport materials, and one or more ambipolar materials, which include materials understood by those skilled in the art to be capable of transporting both holes and electrons. In some embodiments, the first host material comprises a phosphorescent material characterized by a triplet energy (e.g. the energy of a photon emitted as a result of relaxation of the material from the lowest triplet state to the ground state) which is greater than the triplet energy of the first emissive material. In some embodiments, the first host material is at least about 50%, at least about 90%, at least about 95%, or at least about 99% of the first light-emitting layer by weight, wherein the HOMO energy level of the first light-emitting layer is about equal to a HOMO energy level of the first host material, and the LUMO energy level of the first light-emitting layer is about equal to a LUMO energy level of the first host material.

The second host material of the second light-emitting layer may be at least one of: one or more hole-transport materials, one or more electron-transport materials, and one or more ambipolar materials. In some embodiments, the second host material comprises a phosphorescent material characterized by a triplet energy which is greater than the triplet energy of the second emissive material. In some embodiments, the second host material is at least about 50%, at least about 90%, at least about 95%, or at least about 99% of the second light-emitting layer by weight, wherein the HOMO energy level of the second light-emitting layer is about equal to a HOMO energy level of the second host material, and the LUMO energy level of the second light-emitting layer is about equal to a LUMO energy level of the second host material.

The LUMO energy level and HOMO energy level of some materials that may be useful as a first host material and/or a second host material are included in Table 4 below.

TABLE 4

| Host material | LUMO energy level (eV) | HOMO energy level (eV) |
|---|---|---|
| 4CzPBP | −2.60 | −6.06 |
| HO-1 | −3.10 | −6.08 |
| HO-2 | −2.88 | −5.96 |

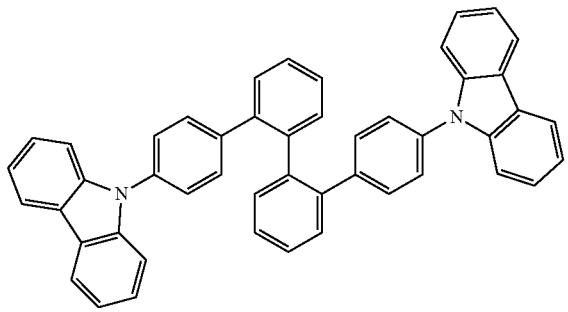

4CzPBP
2,2'-bis(4-carbazolylphenyl)-1,1'-biphenyl

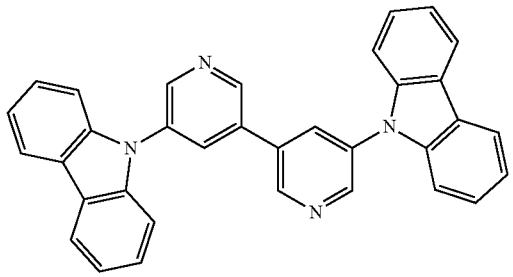

HO-1
5,5'-di(9H-carbazol-9-yl)-3,3'-bipyridine

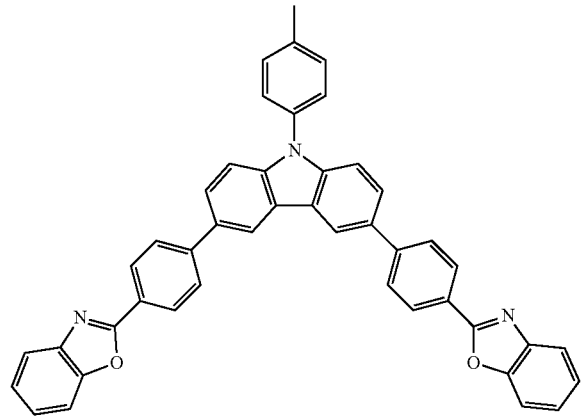

HO-2
2,2'-(4,4'-(9-p-tolyl-9H-carbazole-3,6-diyl)-bis(4,1-phenylene))dibenzo[d]oxazole In some embodiments, the first host material and/or the second host material may comprise 4CzPBP, HO-2, or HO-1.

In some embodiments, the hole-transport layer comprises DTASi, the first host comprises 4CzPBP, the second host comprises HO-2, and the electron-transport layer comprises TPBI. In some embodiments, the hole-transport layer comprises DTASi, the first host comprises HO-1, the second host comprises HO-2, and the electron-transport layer comprises TPBI.

Any suitable emissive material may be used for the first emissive material or the second emissive material. In some embodiments, the first emissive material emits visible photons that have a lower average wavelength than visible photons emitted by the second emissive material. The term "average wavelength" has the ordinary meaning understood by a person of ordinary skill in the art. In some embodiments, the average wavelength includes the wavelength wherein, in an emission spectrum of the material, the area under the curve in the visible range at wavelengths lower than the average wavelength is about equal to the area under the curve in the visible range at wavelengths higher than the average wavelength.

In some embodiments, the first light-emitting layer emits visible photons having an average wavelength in the range of about 400 nm to about 550 nm. In some embodiments, the second light-emitting layer emits visible photons having an average wavelength in the range of about 500 nm to about 750 nm. In some embodiments, the first light-emitting layer and/or the second light-emitting layer comprises an iridium coordination compound such as bis(2-[4,6-difluorophenyl]pyridinato-N,C2')iridium (III) picolinate (FIrPic), bis-{2-[3,5-bis(trifluoromethyl)phenyl]pyridinato-N,C2'}iridium (III)-picolinate, bis(2-[4,6-difluorophenyl]pyridinato-N,C2')iridium(acetylacetonate), Iridium (III) bis(4,6-difluorophenylpyridinato)-3-(trifluoromethyl)-5-(pyridine-2-yl)-1,2,4-triazolate, Iridium (III) bis(4,6-difluorophenylpyridinato)-5-(pyridine-2-yl)-1H-tetrazolate, and bis[2-(4,6-difluoro phenyl)pyridinato-N, C$^{2'}$]iridium (III)tetra(1-pyrazolyl)borate, Bis[2-(2'-benzothienyl)-pyridinato-N,C3'] iridium (III)(acetylacetonate); Bis[(2-phenylquinolyl)-N, C2']iridium (III) (acetylacetonate); Bis[(1-phenylisoquirtolinato-N, C2')]iridium (III) (acetylacetonate); Bis[(dibenzo[f,h]quinoxalino-N,C2') iridium (III)(acetylacetonate); Tris(2,5-bis-2'-(9',9'-dihexylfluorene)pyridine)iridium (III); Tris[1-phenylisoquirtolinato-N,C2']iridium (III); Tris-[2-(2'-benzothienyl)-pyridinato-N,C3']iridium (III); Tris[1-thiophen-2-ylisoquinolinato-N,C3']iridium (III); and Tris[1-(9,9-dimethyl-9H-fluoren-2-yl)isoquinolinato-(N,C3')iridium (III)), Bis(2-phenylpyridinato-N,C2')iridium(III)(acetylacetonate) [Ir(ppy)$_2$(acac)], Bis(2-(4-tolyl)pyridinato-N,C2')iridium(III)(acetylacetonate) [Ir(mppy)$_2$(acac)], Bis(2-(4-tert-butyl)pyridinato-N,C2')iridium (III)(acetylacetonate) [Ir(t-Buppy)$_2$(acac)], Tris(2-phenylpyridinato-N,C2')iridium (III) [Ir(ppy)$_3$], Bis(2-phenyloxazolinato-N,C2')iridium (III) (acetylacetonate) [Ir(op)$_2$(acac)], Tris(2-(4-tolyl)pyridinato-N,C2')iridium(III) [Ir(mppy)$_3$]. etc.

In some embodiments, the second light-emitting layer comprises a yellow emitter and/or a red emitter. Examples of yellow emitters may include, but are not limited to, YE-1, Bis[(2-phenylquinolyl)-N, C2']iridium (III) (acetylacetonate), Ir(pq)$_2$acac; Bis[2-phenylbenzothiazolato-N,C2'] iridium (III)(acetylacetonate), (bt)$_2$Ir(III)(acac); Bis[2-(4-tert-butylphenyl)benzothiazolato-N,C2']iridium(III) (acetylacetonate), (t-bt)$_2$Ir(III)(acac); Bis[(2-(2'-thienyl) pyridinato-N, C3')]iridium (III) (acetylacetonate), (thp)$_2$Ir (III)(acac); Tris[2-(9,9-dimethylfluoren-2-yl)pyridinato -(N, C3')]iridium (III), [Ir(Flpy)$_3$]; Tris[2-(9,9-dimethylfluoren-2-yl)pyridinato-(N,C3')]iridium (III), [Ir(Flpy)$_3$]; Bis[5-trifluoromethyl-2-[3-(N-phenylcarbzolyl)pyridinato-N,C2'] iridium(III)(acetylacetonate), (Cz-CF$_3$)Ir(III)(acac); (2-Ph-PyCz)$_2$Ir(III)(acac).

Examples of red emitters may include, but are not limited to, Ir(piq)$_2$acac, Bis[2-(2'-benzothienyl)-pyridinato-N,C3'] iridium (III)(acetylacetonate); Bis[(2-phenylquinolyl)-N, C2']iridium (III) (acetylacetonate); Bis[(1-phenylisoquinolinato-N,C2')]iridium (III) (acetylacetonate); Bis[(dibenzo[f,h]quinoxalino -N,C2')iridium (III)(acetylacetonate); Tris(2,5-bis-2'-(9',9'-dihexylfluorene)pyridine)iridium (III); Tris[1-phenylisoquinolinato-N,C2']iridium (III); Tris-[2-(2'-benzothienyl)-pyridinato-N,C3']iridium (III); Tris[1-thiophen-2-ylisoquinolinato-N,C3']iridium (III); and Tris[1-(9,9-dimethyl-9H-fluoren-2-yl)isoquinolinato-(N,C3')iridium (III)), etc.

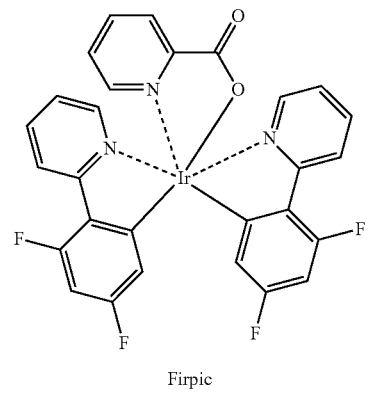

Firpic

Iridium (III) [bis (4,6-difluorophenyl)-pyridinato-N, C2']picolinate

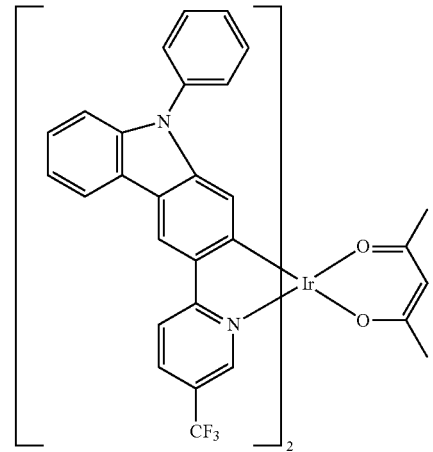

YE-1

Iridium (III) [bis (5-trifluoromethyl-2-[3-(N-phenylcarbazolyl)-pyridinato](acetylacetonate)

-continued

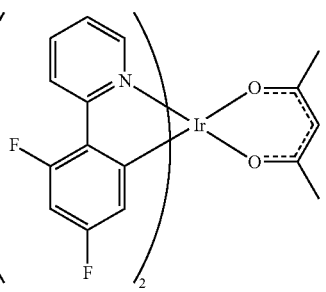

FIr(acac)
bis(2-[4,6-difluorophenyl]pyridinato-
N,C2')iridium(acetylacetonate)

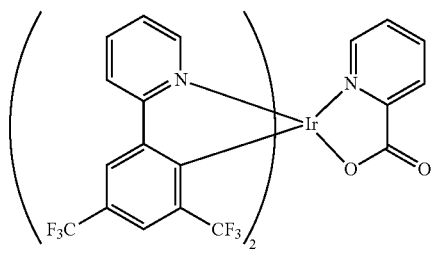

(Ir(CF₃ppy)₂(Pic)
bis-{2-[3,5-
bis(trifluoromethyl)phenyl]pyridinato-
N,C2'}iridium(III)-picolinate

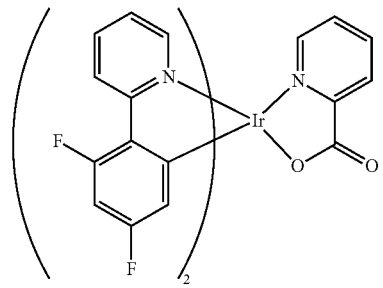

FIrPic
bis(2-[4,6-difluorophenyl]pyridinato-
N,C2')iridium (III) picolinate

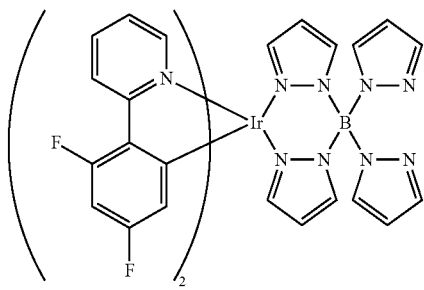

Fir6
bis[2-(4,6-difluorophenyl)pyridinato-
N,C2']iridium(III)tetra(1-pyrazolyl)borate -continued

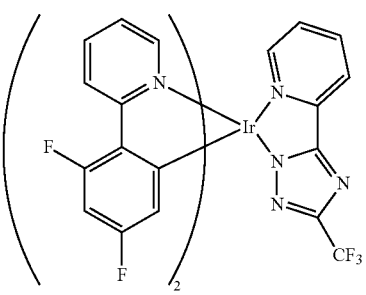

FIrtaz
Iridium (III) bis(4,6-
difluorophenylpyridinato)-3-
(trifluoromethyl)-5-(pyridine-2-yl)-1,2,4-
triazolate

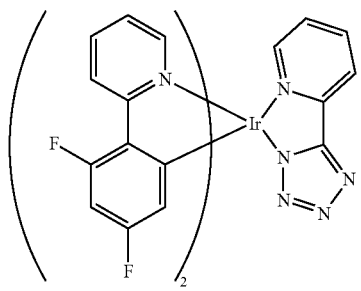

FIrN4
Iridium (III) bis(4,6-
difluorophenylpyridinato)-5-(pyridine-2-yl)-
1H-tetrazolate

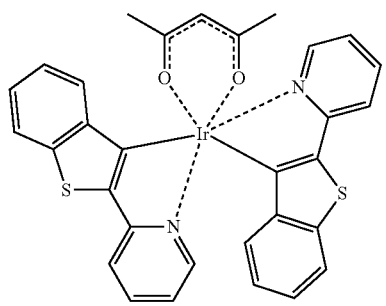

Ir(btp)₂(acac)

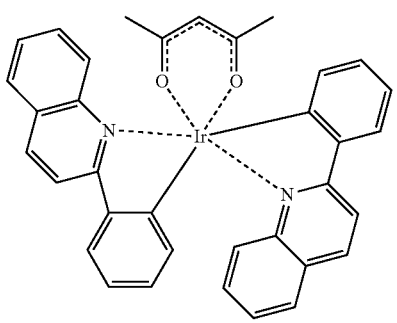

Ir(pq)₂(acac)

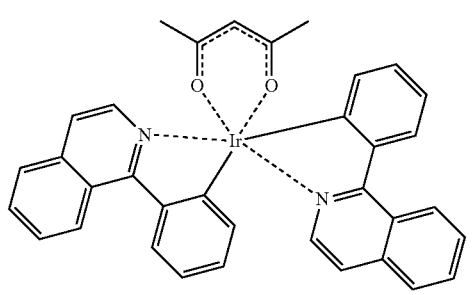

Ir(piq)₂(acac)

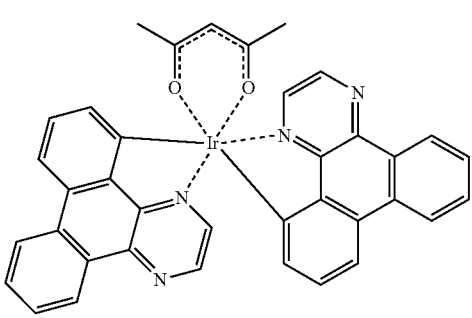

Ir(DBQ)₂(acac)

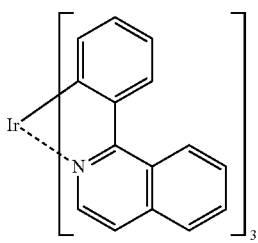

Ir(piq)₃

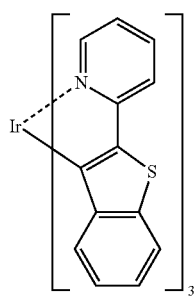

Ir(btp)₃

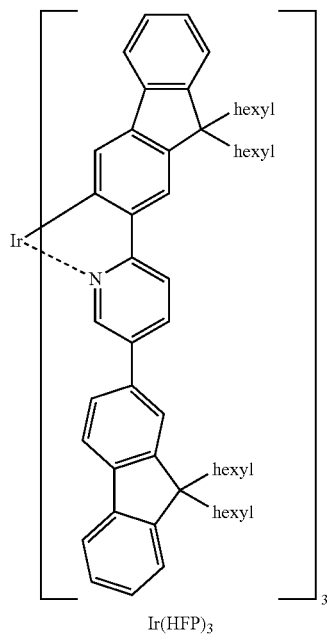

Ir(HFP)₃

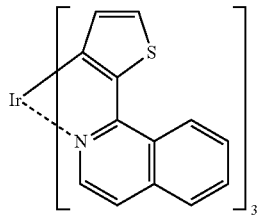

Ir(tiq)₃

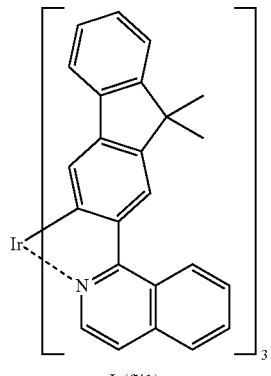

Ir(fli1)₃

1. (Btp)₂Ir(III)(acac); Bis[2-(2'-benzothienyl)-pyridinato-N,C3']iridium (III)(acetylacetonate)
2. (Pq)₂Ir(III)(acac); Bis[(2-phenylquinolyl)-N,C2']iridium (III)(acetylacetonate)
3. (Piq)₂Ir(III)(acac); Bis[(1-phenylisoquinolinato-N,C2')]iridium (III) (acetylacetonate)
4. (DBQ)2Ir(acac); Bis[(dibenzo[f,h]quinoxalino-N,C2') iridium (III) (acetylacetonate)
5. [Ir(HFP)₃], Tris(2,5-bis-2'-(9',9'-dihexylfluorene)pyridine)iridium (III)
6. Ir(piq)₃, Tris[1-phenylisoquinolinato-N,C2']iridium (III)
7. Ir(btp)₃, Tris-[2-(2'-benzothienyl)-pyridinato-N,C3']iridium (III)

8. Ir(tiq)₃, Tris[1-thiophen-2-ylisoquinolinato-N,C3'] iridium (III)
9. Ir(fliq)₃; Tris[1-(9,9-dimethyl-9H-fluoren-2-yl)isoquirtolinato-(N,C3') iridium (III))

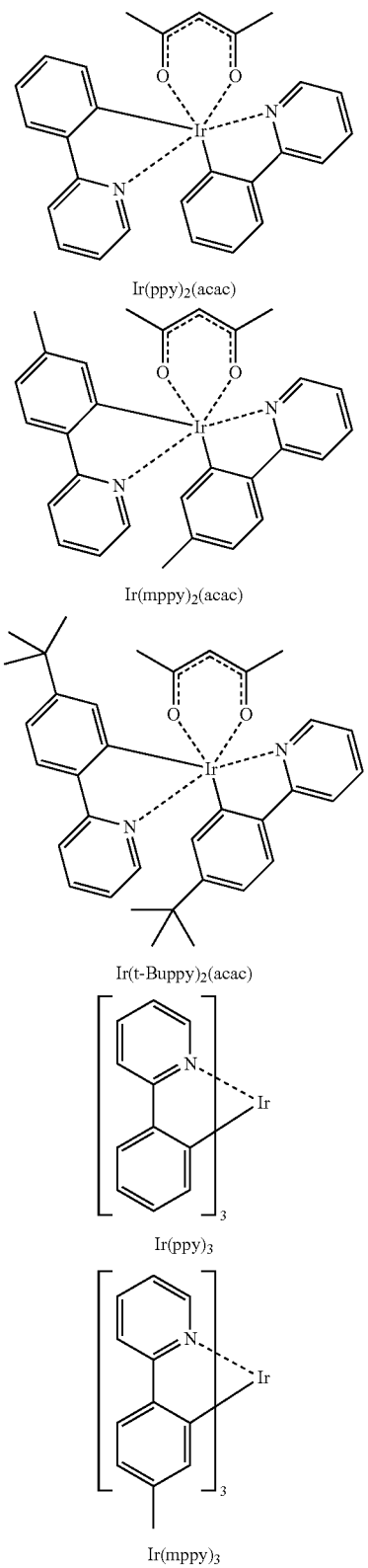

Ir(ppy)₂(acac)

Ir(mppy)₂(acac)

Ir(t-Buppy)₂(acac)

Ir(ppy)₃

Ir(mppy)₃

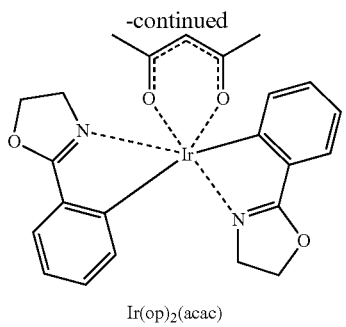

Ir(op)₂(acac)

The HOMO and LUMO energy levels for organic materials to be used in OLEDs may be obtained by several conventional methods known in the art, e.g. solution electrochemistry, ultraviolet photoelectron spectroscopy (UPS), inverse photoemission spectroscopy, etc. In some embodiments, HOMO and LUMO energy levels for organic materials to be used in OLEDs may be obtained using a cyclic voltammetry (CV) instrument (model pAutolab type II) manufactured by Metrohm USA (Riverview, Fla., USA) in conjunction with GPES/FRA software (version 4.9).

The devices described herein may provide an improved luminescent efficiency, a better color rendering index, and/or improved color stability as compared to devices currently known in the art.

In some embodiments, the devices provided herein emit white light, meaning light which appears white to an ordinary observer. In some embodiments, white light is light having the approximate CIE color coordinates (X=⅓, Y=⅓). CIE color coordinates are known in the art to be useful to quantify the color of emitted light, and CIE color coordinates (X=⅓, Y=⅓) is known as the achromatic point. The X and Y color coordinates are weights applied to the CIE primaries to match a color. A more detailed description of these terms may be found in CIE 1971, International Commission on Illumination, Colorimetry: Official Recommendations of the International Commission on Illumination, Publication CIE No. 15 (E-1.3.1) 1971, Bureau Central de la CIE, Paris, 1971 and in F. W. Billmeyer, Jr., M. Saltzman, Principles of Color Technology, 2nd edition, John Wiley & Sons, Inc., New York, 1981, both of which are hereby incorporated by reference in their entireties. The color rendering index (CRI) refers to the ability to render various colors and has values ranging from 0 to 100, with 100 being the best.

EXAMPLE 1

The devices were generally fabricated as follows.

ITO coated glass substrates were cleaned by ultrasound in acetone, and consecutively in 2-propanol, baked at about 110° C. for about 3 hours, followed by treatment with oxygen plasma for about 30 min. A layer of PEDOT: PSS (Baytron P from H. C. Starck) was spin-coated at about 6000 rpm onto the pre-cleaned and O₂-plasma treated (ITO)-substrate and annealed at about 180° C. for about 30 min, yielding a thickness of around 20 nm. In a glove-box hosted vacuum deposition system at a pressure of about 10⁻⁷ torr (1 torr=133.322 Pa), 4,4'4"-tri(N-carbazolyl)triphenylamine (TCTA) was first deposited on top of PEDOT/PSS layer at deposition rate of about 0.06 nm/s, yielding a 40 nm thick film. Then the first emitter (about 12% wt) with the first host was co-deposited on top of TCTA to form a 5-10 nm thick film as first light-emitting layer, followed by co-deposition of the second emitter (about 5% wt) and the second host to form a 1-5 nm thick film as second light-emitting layer. A third light-emitting layer (if necessary) may be prepared by co-deposition of the third emitter and the third host to form a 5-10 nm thick film. A 40 nm thick layer of 1,3,5-tris(N-phenylbenzimidizol-2-yl)benzene (TPBI) was then deposited on top of the second light-emitting layer at deposition rate around 0.06 nm/s. LiF and Al were then deposited successively at deposition rates of 0.005 and 0.2 nm/s, respectively.

EXAMPLE 2

The following device, which has the conventional step-wise decrease in HOMO energy levels and LUMO energy levels, was prepared according to the procedure of Example 1.

| Layer | Material | LUMO (eV) | HOMO (eV) | Emissive Material |
|---|---|---|---|---|
| Hole-transport | DTASi | −2.20 | −5.60 | NA |
| First light-emitting | 4Cz-PBP | −2.60 | −6.06 | FIrPic |
| Second light-emitting | 4Cz-PBP | −2.60 | −6.06 | Ir(pq)2acac |
| Third light-emitting | 4Cz-PBP | −2.60 | −6.06 | FIrPic |
| Electron-transport | TPBI | −2.70 | −6.20 | NA |

Figure 9:
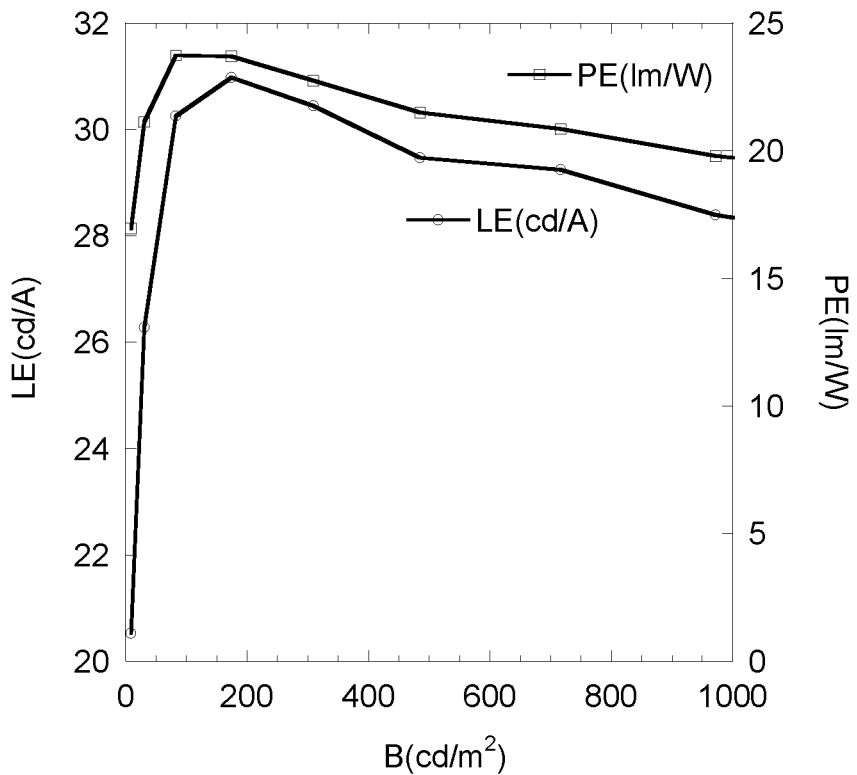
FIG. 9 is a plot of the luminance efficiency (cd/A) and the power efficiency (lm/w) as function of brightness (cd/m2) of an embodiment of a device described herein.

The performance of this device was evaluated by I-V measurements using a Keithley 2400 Source Meter to apply 0-10 V voltage scans and measure the current simultaneously. All device operations were done inside a nitrogen-filled glove-box. FIG. 9 is a plot of the luminance efficiency and the power efficiency of the device at varying brightness. FIG. 9 shows that the luminance efficiency generally ranges from about 28 cd/A to about 31 cd/A, and the power efficiency ranges from about 19 lm/W to about 24 lm/W, at a brightness ranging from about 200 cd/m$^2$ to about 1,000 cd/m$^2$ brightness. At 1,000 cd/m$^2$ brightness, driving under 4.5V (current density 3.4 mA/cm$^2$), the device exhibits luminance efficiency of 28.4 cd/A and power efficiency of 19.6 lm/W.

EXAMPLE 3

The following device, which has the conventional step-wise decrease in HOMO energy levels, was prepared according to the procedure of Example 1.

| Layer | Material | LUMO (eV) | HOMO (eV) | Emissive Material |
|---|---|---|---|---|
| Hole-transport | DTASi | −2.20 | −5.60 | NA |
| First light-emitting | HO-1 | −3.10 | −6.08 | FIrPic |
| Second light-emitting | HO-1 | −3.10 | −6.08 | Ir(pq)2acac |
| Third light-emitting | HO-1 | −3.10 | −6.08 | FIrPic |
| Electron-transport | TPBI | −2.70 | −6.20 | NA |

Figure 10:
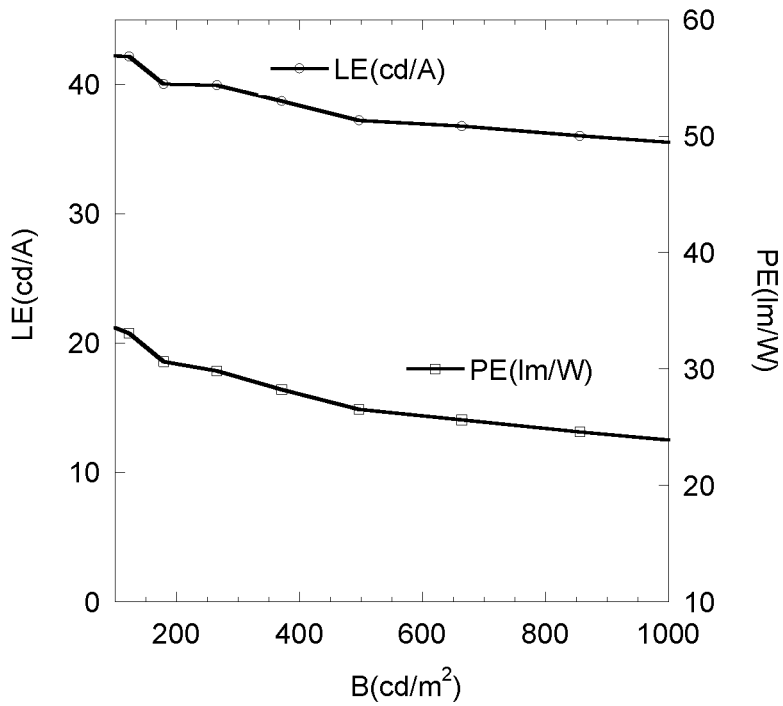
FIG. 10 is a plot of the luminance efficiency (cd/A) and the power efficiency (lm/w) as function of brightness (cd/m2) of an embodiment of a device described herein.

The performance of this device was evaluated by I-V measurements using a Keithley 2400 Source Meter to apply 0-10 V voltage scans and measure the current simultaneously. All device operations were done inside a nitrogen-filled glove-box. FIG. 10 is a plot of the luminance efficiency and the power efficiency of the device at varying brightness. FIG. 10 shows that the luminance efficiency generally ranges from about 37 cd/A to about 42 cd/A, and the power efficiency ranges from about 24 lm/W to about 33 lm/W, at a brightness ranging from about 200 cd/m$^2$ to about 1,000 cd/m$^2$ brightness. At 1,000 cd/m$^2$ brightness, driving under 3.6V, the device exhibits luminance efficiency of 37.0 cd/A and power efficiency of 24.0 lm/W, which is more efficient than the device of Example 2.

EXAMPLE 4

The following device was prepared according to the procedure of Example 1.

| Layer | Material | LUMO (eV) | HOMO (eV) | Emissive Material |
|---|---|---|---|---|
| Hole-transport | DTASi | −2.20 | −5.60 | NA |
| First light-emitting | 4CzPBP | −2.60 | −6.06 | FIrPic |
| Second light-emitting | HO-2 | −2.88 | −5.96 | Ir(piq)2acac, YE-1 |
| Electron-transport | TPBI | −2.70 | −6.20 | NA |

Figures 11A, 11B:
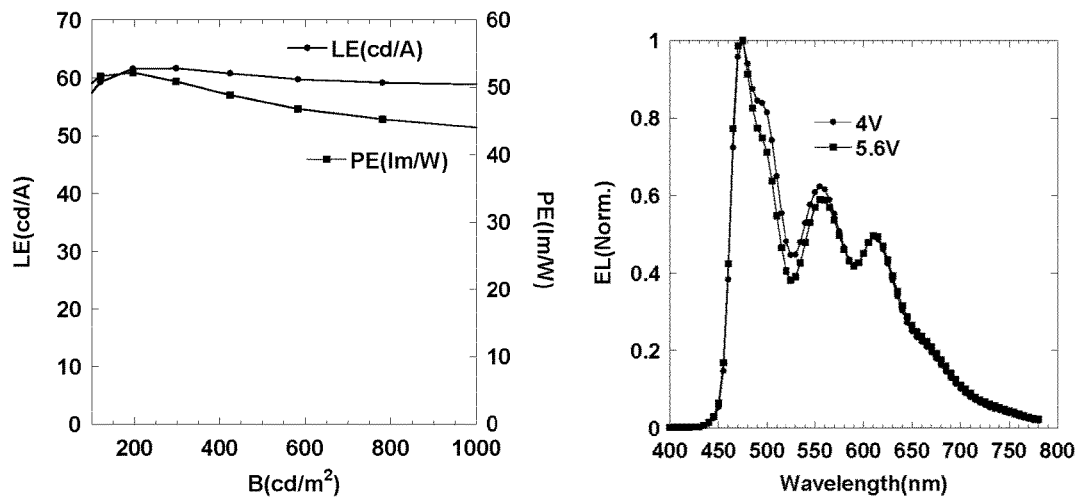
FIG. 11a is a plot of the luminance efficiency (cd/A) and the power efficiency (lm/w) as function of brightness (cd/m2) of an embodiment of a device described herein.
FIG. 11b is a plot of the electroluminescence spectrum of an embodiment of a device described herein.

The performance of this device was evaluated by I-V measurements using a Keithley 2400 Source Meter to apply 0-10 V voltage scans and measure the current simultaneously. All device operations were done inside a nitrogen-filled glove-box. FIG. 11a is a plot of the luminance efficiency and the power efficiency of the device at varying brightness. FIG. 11a shows that the luminance efficiency generally ranges from about 58 cd/A to about 62 cd/A, and the power efficiency ranges from about 44 lm/W to about 50 lm/W, at a brightness ranging from about 200 cd/m$^2$ to about 1,000 cd/m$^2$ brightness. At 1,000 cd/m$^2$ brightness, driving under 4.2V and current density of 1.7 mA/cm$^2$, the device exhibits luminance efficiency of 59.0 cd/A and power efficiency of 44.0 lm/W, and is thus more efficient than the devices of Example 2 and Example 3. FIG. 11b is a plot of the electroluminescence spectrum of the same device, showing strong emission in the visible range, with CIE (0.334, 0.396), CRI(74).

EXAMPLE 5

The following device was prepared according to the procedure of Example 1.

| Layer | Material | LUMO (eV) | HOMO (eV) | Emissive Material |
|---|---|---|---|---|
| Hole-transport | DTASi | −2.20 | −5.60 | NA |
| First light-emitting | HO-1 | −3.10 | −6.08 | FIrPic |
| Second light-emitting | HO-2 | −2.88 | −5.96 | Ir(piq)2acac, YE-1 |
| Electron-transport | TPBI | −2.70 | −6.20 | NA |

Figure 12:
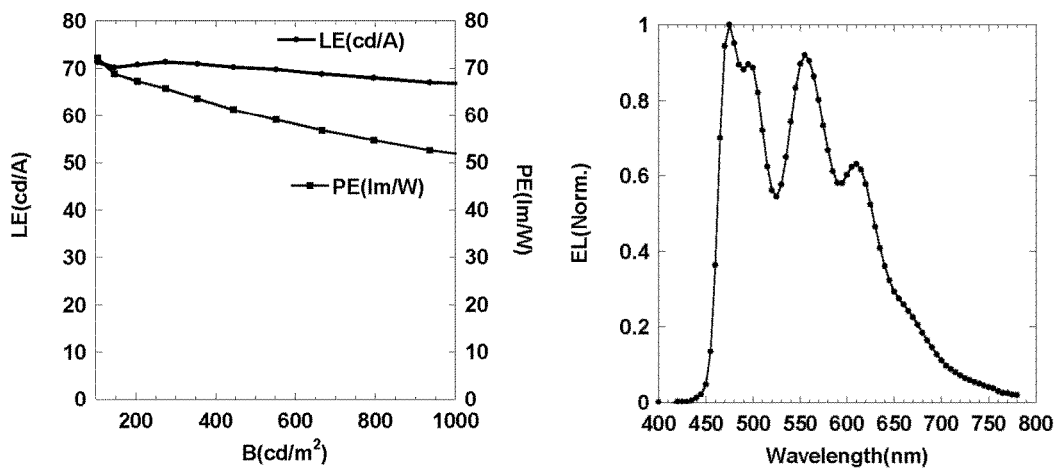
FIG. 12a is a plot of the luminance efficiency (cd/A) and the power efficiency (lm/w) as function of brightness (cd/m2) of an embodiment of a device described herein.
FIG. 12b is a plot of the electroluminescence spectrum of an embodiment of a device described herein.

The performance of this device was evaluated by I-V measurements using a Keithley 2400 Source Meter to apply 0-10 V voltage scans and measure the current simultaneously. All device operations were done inside a nitrogen-filled glove-box. FIG. 12a is a plot of the luminance efficiency and the power efficiency of the device at varying brightness. FIG. 12a shows that the luminance efficiency generally ranges from about 66 cd/A to about 72 cd/A, and the power efficiency ranges from about 51 lm/W to about 70 lm/W, at a brightness ranging from about 200 cd/m$^2$ to about 1,000 cd/m$^2$ brightness. At 1,000 cd/m$^2$ brightness, driving under 4.1V, the device exhibits luminance efficiency of 66.0 cd/A and power efficiency of 51.0 lm/W, and is thus more efficient than the devices of Example 2 and Example 3. FIG. 12b is a plot of the electroluminescence spectrum of the same device showing strong emission in the visible range, with CIE (0.35, 0.43), CRI(68).

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Thus, it is intended that the scope of the present invention herein disclosed should not be limited by the particular disclosed embodiments described above, but should be determined only by a fair reading of the claims that follow.

What is claimed is:

1. An organic light-emitting device comprising:
   a cathode, an anode, and a series of organic layers disposed between the anode and the cathode, wherein the series of organic layers comprises:
   a first light-emitting layer deposited between the anode and the cathode, wherein the first light-emitting layer comprises a first host material and a first emissive material;
   a hole-transport layer, disposed between the anode and the first light-emitting layer;
   a second light-emitting layer disposed between the first light-emitting layer and the cathode, wherein the second light-emitting layer comprises a second host material, a second emissive material, and a third emissive material; and
   an electron-transport layer disposed between the second light-emitting layer and the cathode;
   wherein a HOMO energy level of the hole-transport layer is higher than a HOMO energy level of the electron-transport layer, and a LUMO energy level of the hole-transport layer is higher than a LUMO energy level of the electron transport layer; and
   at least one of the following relationships exists:
   a HOMO energy level of the first light-emitting layer is higher than the HOMO energy level of the hole-transport layer;
   a LUMO energy level of the first light-emitting layer is lower than a LUMO energy level of the second light-emitting layer;
   a HOMO energy level of the second light-emitting layer is higher than the HOMO energy level of the first light-emitting layer; or
   the LUMO energy level of the second light-emitting layer is lower than a LUMO energy level of the electron-transport layer.

2. The organic light-emitting device of claim 1, wherein the HOMO energy level of the second light-emitting layer is higher than the HOMO energy level of the first light-emitting layer, and the LUMO energy level of the first light-emitting layer is lower than the LUMO energy level of the second light-emitting layer.

3. The organic light-emitting device of claim 1, wherein the HOMO energy level of the second light-emitting layer is higher than the HOMO energy level of the first light-emitting layer, and the LUMO energy level of the second light-emitting layer is lower than the LUMO energy level of the electron-transport layer.

4. The organic light-emitting device of claim 1, wherein the HOMO energy level of the second light-emitting layer is higher than the HOMO energy level of the first light-emitting layer, the LUMO energy level of the first light-emitting layer is lower than the LUMO energy level of the second light-emitting layer, and the LUMO energy level of the second light-emitting layer is lower than the LUMO energy level of the electron-transport layer.

5. The organic light-emitting device of claim 1, wherein the hole-transport layer comprises a hole-transport compound having a HOMO energy level and a LUMO energy level, wherein the HOMO energy level of the hole-transport layer is about equal to the HOMO energy level of the hole-transport compound, and the LUMO energy level of the hole-transport layer is about equal to the LUMO energy level of the hole-transport compound.

6. The organic light-emitting device of claim 1, wherein the electron-transport layer comprises an electron-transport compound having a HOMO energy level and a LUMO energy level, wherein the HOMO energy level of the electron-transport layer is about equal to the HOMO energy level of the electron-transport compound, and the LUMO energy level of the electron-transport layer is about equal to the LUMO energy level of the electron-transport compound.

7. The organic light-emitting device of claim 1, wherein the first host material is at least about 50% of the first light-emitting layer by weight, wherein the HOMO energy level of the first light-emitting layer is about equal to a HOMO energy level of the first host material, and the LUMO energy level of the first light-emitting layer is about equal to a LUMO energy level of the first host material.

8. The organic light-emitting device of claim 1, wherein the second host material is at least about 50% of the second light-emitting layer by weight, wherein the HOMO energy level of the second light-emitting layer is about equal to a HOMO energy level of the second host material, and the LUMO energy level of the second light-emitting layer is about equal to a LUMO energy level of the second host material.

9. The organic light-emitting device of claim 1, wherein the first emissive material emits visible photons that have a lower average wavelength than visible photons emitted by the second emissive material and the third emissive material.

10. The organic light-emitting device of claim 1, wherein the first light-emitting layer emits visible photons having an average wavelength in the range of about 400 nm to about 550 nm.

11. The organic light-emitting device of claim 1, wherein the first light-emitting layer comprises an iridium coordination compound.

12. The organic light-emitting device of claim 11, wherein the iridium coordination compound is FIrPic.

13. The organic light-emitting device of claim 1, wherein the second light-emitting layer comprises an iridium coordination compound.

14. The organic light-emitting device of claim 1, wherein the second light-emitting layer emits visible photons having an average wavelength in the range of about 500 nm to about 750 nm.

15. The organic light-emitting device of claim 1, wherein the second two emission materials are a yellow emitter and a red emitter.

16. The organic light-emitting device of claim 15, wherein the yellow emitter is YE–1or Ir(pq)$_2$acac.

17. The organic light-emitting device of claim 15, wherein the red emitter is Ir(piq)$_2$acac.

18. The organic light-emitting device of claim 1, wherein the hole-transport layer comprises DTASi, the first host comprises 4CzPBP, the second host comprises HO-2, and the electron-transport layer comprises TPBI.

19. The organic light-emitting device of claim 1, wherein the hole-transport layer comprises DTASi, the first host comprises HO-1, the second host comprises HO-2, and the electron-transport layer comprises TPBI.

* * * * *